US012609664B2

(12) United States Patent
Takahashi

(10) Patent No.: US 12,609,664 B2
(45) Date of Patent: Apr. 21, 2026

(54) RADIO-FREQUENCY MODULE AND COMMUNICATION DEVICE

(71) Applicant: Murata Manufacturing Co., Ltd., Nagaokakyo (JP)

(72) Inventor: Hidetaka Takahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 434 days.

(21) Appl. No.: 18/482,035

(22) Filed: Oct. 6, 2023

(65) Prior Publication Data

US 2024/0039490 A1 Feb. 1, 2024

Related U.S. Application Data

(63) Continuation of application No. PCT/JP2022/009548, filed on Mar. 4, 2022.

(30) Foreign Application Priority Data

Apr. 9, 2021 (JP) ................................. 2021-066617

(51) Int. Cl.
*H03F 1/02* (2006.01)
*H03F 3/24* (2006.01)
*H04B 1/38* (2015.01)

(52) U.S. Cl.
CPC ....... *H03F 3/245* (2013.01); *H03F 2200/372* (2013.01); *H03F 2200/451* (2013.01); *H04B 1/38* (2013.01)

(58) Field of Classification Search
CPC ..................................... H03F 1/02; H03F 1/07
USPC ............................................. 330/124 R, 295
See application file for complete search history.

(56) References Cited

FOREIGN PATENT DOCUMENTS

| JP | 2014-116844 A | 6/2014 |
| JP | 2018-137566 A | 8/2018 |
| JP | 2020-126921 A | 8/2020 |
| WO | 2019/049647 A1 | 3/2019 |

OTHER PUBLICATIONS

International Search Report and Written Opinion mailed on Jun. 7, 2022, received for PCT Application PCT/JP2022/009548, filed on Mar. 4, 2022, 08 pages including English Translation.

*Primary Examiner* — Henry Choe
(74) *Attorney, Agent, or Firm* — XSENSUS LLP

(57) ABSTRACT

Deterioration of characteristics is reduced. A radio-frequency module includes a first power amplifier circuit, a second power amplifier circuit, and a substrate. The first power amplifier circuit includes a first amplifier component and a first transformer. The second power amplifier circuit includes a second amplifier component and a second transformer. The radio-frequency module further includes a long bump disposed on one main surface of the substrate. The first amplifier component is disposed on the one main surface of the substrate with the long bump interposed between the first amplifier component and the one main surface of the substrate. The long bump is located between the first transformer and the second transformer when viewed in plan in a thickness direction of the substrate.

20 Claims, 10 Drawing Sheets

RADIO-FREQUENCY MODULE AND COMMUNICATION DEVICE

CROSS-REFERENCE TO RELATED APPLICATIONS

This is a continuation application of PCT/JP2022/009548, filed on Mar. 4, 2022, designating the United States of America, which is based on and claims priority to Japanese Patent Application No. JP 2021-066617, filed on Apr. 9, 2021. The entire contents of the above-identified applications, including the specifications, drawings and claims, are incorporated herein by reference in their entirety.

TECHNICAL FIELD

The present disclosure relates generally to a radio-frequency module and a communication device and, more particularly, to a radio-frequency module including a plurality of power amplifier circuits, and a communication device including the radio-frequency module.

BACKGROUND ART

Patent Document 1 discloses an amplification device. The amplification device disclosed in Patent Document 1 includes an amplifier, a first output transformer, and a first phase conversion element. The amplifier amplifies, in an area where a power level of an input signal is greater than or equal to a first level, a first signal split from the input signal and outputs a second signal. The first output transformer includes a first input-side winding to which the second signal is input, and a first output-side winding that is electromagnetically coupled to the first input-side winding. The first phase conversion element is connected in parallel with the first output-side winding and outputs a fifth signal having a phase that leads a signal output from the first output-side winding by approximately $\varphi$ degrees.

CITATION LIST

Patent Document

Patent Document 1: Japanese Unexamined Patent Application Publication No. 2018-137566

SUMMARY OF DISCLOSURE

Technical Problem

Incidentally, in a radio-frequency module including a plurality of transformers, in some cases, crosstalk may occur between the plurality of transformers to result in deterioration of characteristics.

The present disclosure has been made in view of the above-described issues and aims to provide a radio-frequency module and a communication device that can reduce deterioration of characteristics.

Solution to Problem

A radio-frequency module according to an aspect of the present disclosure includes a first power amplifier circuit, a second power amplifier circuit, and a substrate. The first power amplifier circuit amplifies a first transmission signal in a transmission band of a first communication band. The second power amplifier circuit amplifies a second transmission signal in a transmission band of a second communication band. The substrate has one main surface. The first power amplifier circuit includes a first amplifier component and a first transformer. The first amplifier component includes a first amplifier element and a second amplifier element. The first transformer includes a first coil and a second coil. A first end of the first coil is connected to an output terminal of the first amplifier element. A second end of the first coil is connected to an output terminal of the second amplifier element. The second coil is connected to an output terminal of the first power amplifier circuit. The second power amplifier circuit includes a second amplifier component and a second transformer. The second amplifier component includes a third amplifier element and a fourth amplifier element. The second transformer includes a third coil and a fourth coil. A first end of the third coil is connected to an output terminal of the third amplifier element. A second end of the third coil is connected to an output terminal of the fourth amplifier element. The fourth coil is connected to an output terminal of the second power amplifier circuit. The radio-frequency module further includes a long bump. The long bump is disposed on the one main surface of the substrate. The first amplifier component is disposed on the one main surface of the substrate with the long bump interposed between the first amplifier component and the one main surface of the substrate. The long bump is located between the first transformer and the second transformer when viewed in plan in a thickness direction of the substrate.

A communication device according to another aspect of the present disclosure includes the radio-frequency module and a signal processing circuit. The signal processing circuit processes a signal for the radio-frequency module.

Advantageous Effects of Disclosure

The radio-frequency module and the communication device according to the above-described aspects of the present disclosure can reduce deterioration of characteristics.

DESCRIPTION OF EMBODIMENTS

A radio-frequency module and a communication device according to Embodiments 1 to 7 will be described below with reference to the drawings. Figures that are referred to in the following embodiments and others are schematic views or diagrams, and a size ratio and a thickness ratio between components in each figure do not necessarily reflect actual dimensional ratios.

Embodiment 1

(1) Radio-Frequency Module

The configuration of a radio-frequency module 1 according to Embodiment 1 will be described with reference to drawings.

Figure 5:
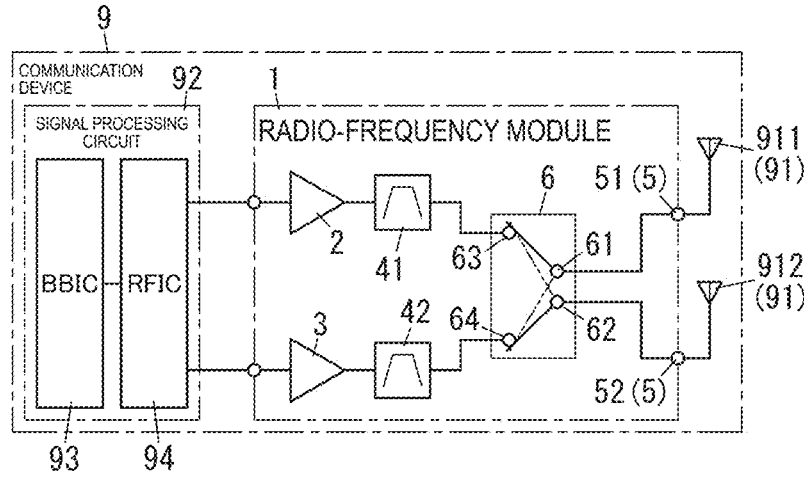
FIG. 5 is a schematic diagram of a communication device according to Embodiment 1.

The radio-frequency module 1 according to Embodiment 1 includes, as illustrated in FIG. 5, a first power amplifier circuit 2, a second power amplifier circuit 3, a first transmission filter 41, a second transmission filter 42, a plurality of antenna terminals 5, and a switch 6.

The radio-frequency module 1 according to Embodiment 1 is used, for example, in a communication device 9 that supports multiple modes/multiple bands. Although the communication device 9 is, for example, a mobile phone (such as a smartphone), the communication device 9 is not limited to the mobile phone and may be, for example, a wearable terminal (such as a smartwatch). The radio-frequency module 1 is a module capable of supporting, for example, the 4G (fourth generation mobile communication) standard, the 5G (fifth generation mobile communication) standard, and other standards. An example of the 4G standard is the 3GPP (3rd Generation Partner Project) LTE (Long Term Evolution) standard. An example of the 5G standard is the 5G NR (New Radio). The radio-frequency module 1 is a module capable of supporting Carrier Aggregation and Dual connectivity. Here, carrier aggregation and dual connectivity refer to communication in which radio waves in a plurality of frequency bands are used simultaneously.

The radio-frequency module 1 according to Embodiment 1 can perform communication of a signal in a frequency band (communication band) specified in the 4G standard and communication of a signal in another frequency band (communication band) specified in the 4G standard simultaneously. The radio-frequency module 1 can perform communication of a signal in a frequency band (communication band) specified in the 4G standard and communication of a signal in a frequency band (communication band) specified in the 5G standard simultaneously. The radio-frequency module 1 can perform communication of a signal in a frequency band (communication band) specified in the 5G standard and communication of a signal in another frequency band (communication band) specified in the 5G standard simultaneously. Hereinafter, communication based on carrier aggregation or dual connectivity is also referred to as simultaneous communication.

(2) Components of Radio-Frequency Module

Components of the radio-frequency module 1 according to Embodiment 1 will be described below with reference to drawings.

(2.1) First Transmission Filter

The first transmission filter 41 illustrated in FIG. 5 is, for example, a mid-band filter. The first transmission filter 41 passes a first transmission signal in a first frequency band included in a mid-band. In Embodiment 1, the first transmission filter 41 passes, as the first transmission signal in the first frequency band, a first transmission signal in a first communication band specified in the 4G standard. Here, the first communication band is, for example, Band 4 (transmission band of 1710 MHz to 1755 MHz, reception band of 2110 MHz to 2155 MHz) specified in the 4G standard. That is, the first transmission signal is a signal in the frequency band in which a transmission band ranges from 1710 MHz to 1755 MHz.

(2.2) Second Transmission Filter

The second transmission filter 42 illustrated in FIG. 5 is, for example, a mid-band filter. The second transmission filter 42 passes a second transmission signal in a second frequency band included in the mid-band. In Embodiment 1, the second transmission filter 42 passes, as the second transmission signal in the second frequency band, a second transmission signal in a second communication band specified in the 4G standard. Here, the second communication band is, for example, Band 1 (transmission band of 1920 MHz to 1980 MHz, reception band of 2110 MHz to 2170 MHz) specified in the 4G standard. That is, the second transmission signal is a signal in the frequency band in which a transmission band ranges from 1920 MHz to 1980 MHz.

(2.3) Antenna Terminals

The plurality of antenna terminals 5 include a first antenna terminal 51 and a second antenna terminal 52 as illustrated in FIG. 5. The first antenna terminal 51 is electrically connected to a first antenna 911 to be described later. The second antenna terminal 52 is electrically connected to a second antenna 912 to be described later.

(2.4) Switch

The switch 6 is a switch that switches between connection destinations of the plurality of respective antenna terminals 5 (that is, a plurality of respective antennas 91) as illustrated in FIG. 5. The switch 6 includes a plurality of (for example, two in the figure) common terminals 61 and 62, and a plurality of (for example, two in the figure) selection terminals 63 and 64.

The common terminal 61 is electrically connected to the first antenna terminal 51. That is, the common terminal 61 is electrically connected to the first antenna 911 via the first antenna terminal 51. Incidentally, for example, a filter or coupler not illustrated may be provided between the common terminal 61 and the first antenna 911. The common terminal 62 is electrically connected to the second antenna terminal 52. That is, the common terminal 62 is electrically connected to the second antenna 912 via the second antenna terminal 52. Incidentally, for example, a filter or coupler not illustrated may be provided between the common terminal 62 and the second antenna 912. The selection terminal 63 is electrically connected to the first transmission filter 41. The selection terminal 64 is electrically connected to the second transmission filter 42.

The switch 6 selects, as a connection destination of the common terminal 61, at least one of the plurality of selection terminals 63 and 64. That is, the switch 6 selectively connects the first transmission filter 41 and the second transmission filter 42 to the first antenna 911. Furthermore, the switch 6 selects, as a connection destination of the common terminal 62, at least one of the plurality of selection terminals 63 and 64. That is, the switch 6 selectively connects the first transmission filter 41 and the second transmission filter 42 to the second antenna 912. Furthermore, the switch 6 can connect one antenna terminal 5 (first antenna terminal 51 or second antenna terminal 52) to the first transmission filter 41 and the second transmission filter 42 simultaneously. That is, the switch 6 can connect one antenna 91 (first antenna 911 or second antenna 912) to the first transmission filter 41 and the second transmission filter 42 simultaneously.

(2.5) First Power Amplifier Circuit

Figure 4:
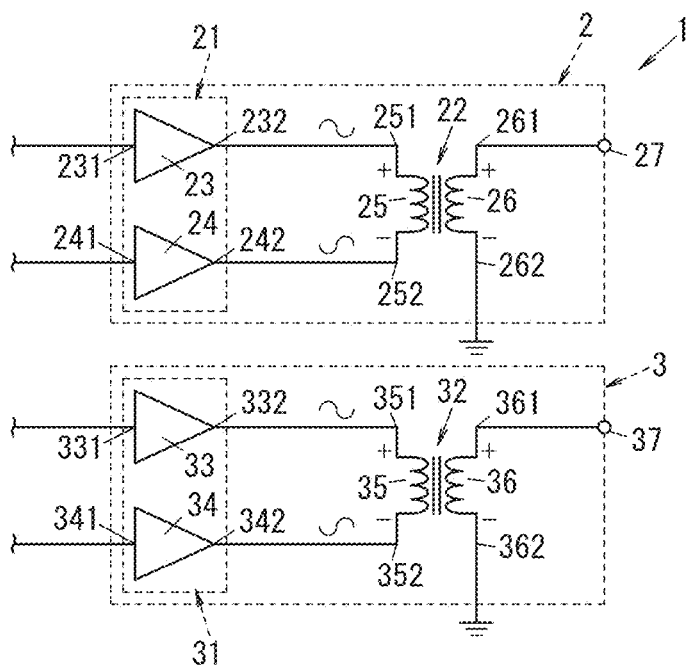
FIG. 4 is a circuit diagram of a main section of the radio-frequency module described above.

The first power amplifier circuit 2 includes a first amplifier component 21 and a first output transformer 22 as illustrated in FIG. 4. The first power amplifier circuit 2 amplifies a first transmission signal in the transmission band of the first communication band. The first power amplifier circuit 2 amplifies a first transmission signal output from a signal processing circuit 92 (see FIG. 5) and outputs the amplified first transmission signal to the first transmission filter 41 (see FIG. 5).

The first amplifier component 21 includes a first amplifier element 23 and a second amplifier element 24. The first amplifier component 21 amplifies a first transmission signal. The first amplifier component 21 amplifies a first transmission signal output from the signal processing circuit 92 (see FIG. 5) and outputs the first transmission signal to the first output transformer 22.

The first amplifier element 23 amplifies the first transmission signal. More particularly, the first amplifier element 23 amplifies a non-inverted input signal of the first transmission signal. The first amplifier element 23 includes an input terminal 231 and an output terminal 232. The non-inverted input signal of the first transmission signal is input to the input terminal 231 of the first amplifier element 23. The output terminal 232 of the first amplifier element 23 is electrically connected to a first coil 25 of the first output transformer 22. Specifically, the output terminal 232 of the first amplifier element 23 is electrically connected to a first end 251 of the first coil 25.

The second amplifier element 24 amplifies the first transmission signal. More particularly, the second amplifier element 24 amplifies a signal that is opposite in phase to the first transmission signal, that is, an inverted input signal. The second amplifier element 24 includes an input terminal 241 and an output terminal 242. The inverted input signal of the first transmission signal is input to the input terminal 241 of the second amplifier element 24. The output terminal 242 of the second amplifier element 24 is electrically connected to the first coil 25 of the first output transformer 22. Specifically, the output terminal 242 of the second amplifier element 24 is electrically connected to a second end 252 of the first coil 25.

The first output transformer 22 includes the first coil 25 and a second coil 26. In the first output transformer 22, the first coil 25 and the second coil 26 are electromagnetically coupled to each other.

The first end 251 of the first coil 25 is electrically connected to the output terminal 232 of the first amplifier element 23, and the second end 252 of the first coil 25 is electrically connected to the output terminal 242 of the second amplifier element 24. In the first output transformer 22, a bias voltage is supplied to a midpoint of the first coil 25.

A first end 261 of the second coil 26 is electrically connected to an output terminal 27 of the first power amplifier circuit 2, and a second end 262 of the second coil 26 is connected to a ground. In other words, the first output transformer 22, the output terminal 232 of the first amplifier element 23, and the output terminal 242 of the second amplifier element 24 are electrically connected to the output terminal 27.

The non-inverted input signal amplified by the first amplifier element 23 and the inverted input signal amplified by the second amplifier element 24 are subjected to impedance conversion in the first output transformer 22 while remaining in opposite phase.

(2.6) Second Power Amplifier Circuit

The second power amplifier circuit 3 includes a second amplifier component 31 and a second output transformer 32 as illustrated in FIG. 4. The second power amplifier circuit 3 amplifies a second transmission signal in the transmission band of the second communication band. The second power amplifier circuit 3 amplifies a second transmission signal output from the signal processing circuit 92 (see FIG. 5) and outputs the amplified second transmission signal to the second transmission filter 42 (see FIG. 5).

The second amplifier component 31 includes a third amplifier element 33 and a fourth amplifier element 34. The second amplifier component 31 amplifies a second transmission signal. The second amplifier component 31 amplifies a second transmission signal output from the signal processing circuit 92 (see FIG. 5) and outputs the second transmission signal to the second output transformer 32.

The third amplifier element 33 amplifies the second transmission signal. More particularly, the third amplifier element 33 amplifies a non-inverted input signal of the second transmission signal. The third amplifier element 33 includes an input terminal 331 and an output terminal 332. The non-inverted input signal of the second transmission signal is input to the input terminal 331 of the third amplifier element 33. The output terminal 332 of the third amplifier element 33 is electrically connected to a third coil 35 of the second output transformer 32. Specifically, the output terminal 332 of the third amplifier element 33 is electrically connected to a first end 351 of the third coil 35.

The fourth amplifier element 34 amplifies the second transmission signal. More particularly, the fourth amplifier element 34 amplifies a signal that is opposite in phase to the second transmission signal, that is, an inverted input signal. The fourth amplifier element 34 includes an input terminal 341 and an output terminal 342. The inverted input signal of the second transmission signal is input to the input terminal 341 of the fourth amplifier element 34. The output terminal 342 of the fourth amplifier element 34 is electrically connected to the third coil 35 of the second output transformer 32. Specifically, the output terminal 342 of the fourth amplifier element 34 is electrically connected to a second end 352 of the third coil 35.

The second output transformer 32 includes the third coil 35 and a fourth coil 36. In the second output transformer 32, the third coil 35 and the fourth coil 36 are electromagnetically coupled to each other.

The first end 351 of the third coil 35 is electrically connected to the output terminal 332 of the third amplifier element 33, and the second end 352 of the third coil 35 is electrically connected to the output terminal 342 of the fourth amplifier element 34. In the second output transformer 32, a bias voltage is supplied to a midpoint of the third coil 35.

A first end 361 of the fourth coil 36 is electrically connected to an output terminal 37 of the second power amplifier circuit 3, and a second end 362 of the fourth coil 36 is connected to the ground. In other words, the second output transformer 32, the output terminal 332 of the third amplifier element 33, and the output terminal 342 of the fourth amplifier element 34 are electrically connected to the output terminal 37.

The non-inverted input signal amplified by the third amplifier element 33 and the inverted input signal amplified by the fourth amplifier element 34 are subjected to impedance conversion in the second output transformer 32 while remaining in opposite phase.

(3) Communication Device

The communication device 9 according to Embodiment 1 includes, as illustrated in FIG. 5, the radio-frequency module 1, the plurality of (for example, two in the figure) antennas 91, and the signal processing circuit 92. The signal processing circuit 92 performs signal processing on a signal that is to pass through the radio-frequency module 1. The signal processing circuit 92 includes a baseband signal processing circuit 93 and an RF signal processing circuit 94.

As illustrated in FIG. 5, the baseband signal processing circuit 93 is, for example, a BBIC (Baseband Integrated Circuit) and is electrically connected to the RF signal processing circuit 94. The baseband signal processing circuit 93 generates an I-phase signal and a Q-phase signal from a baseband signal. The baseband signal processing circuit 93 performs an IQ modulation process by combining the I-phase signal and the Q-phase signal to output a transmission signal. At this time, the transmission signal is generated as a modulated signal obtained by performing amplitude modulation on a carrier signal having a predetermined frequency with a period longer than a period of the carrier signal.

As illustrated in FIG. 5, the RF signal processing circuit 94 is, for example, an RFIC (Radio Frequency Integrated Circuit) and is provided between the radio-frequency module 1 and the baseband signal processing circuit 93. The RF signal processing circuit 94 has a function of performing signal processing on a transmission signal from the baseband signal processing circuit 93 and a function of performing signal processing on reception signals received by the antennas 91. The RF signal processing circuit 94 is a multiband processing circuit and can generate and amplify transmission signals in a plurality of communication bands.

Incidentally, in the communication device 9, the baseband signal processing circuit 93 is not an indispensable component.

(4) Layout and Configuration

Next, the layout and configuration of the first power amplifier circuit 2 and the second power amplifier circuit 3 in the radio-frequency module 1 will be described with reference to drawings.

Figure 1:
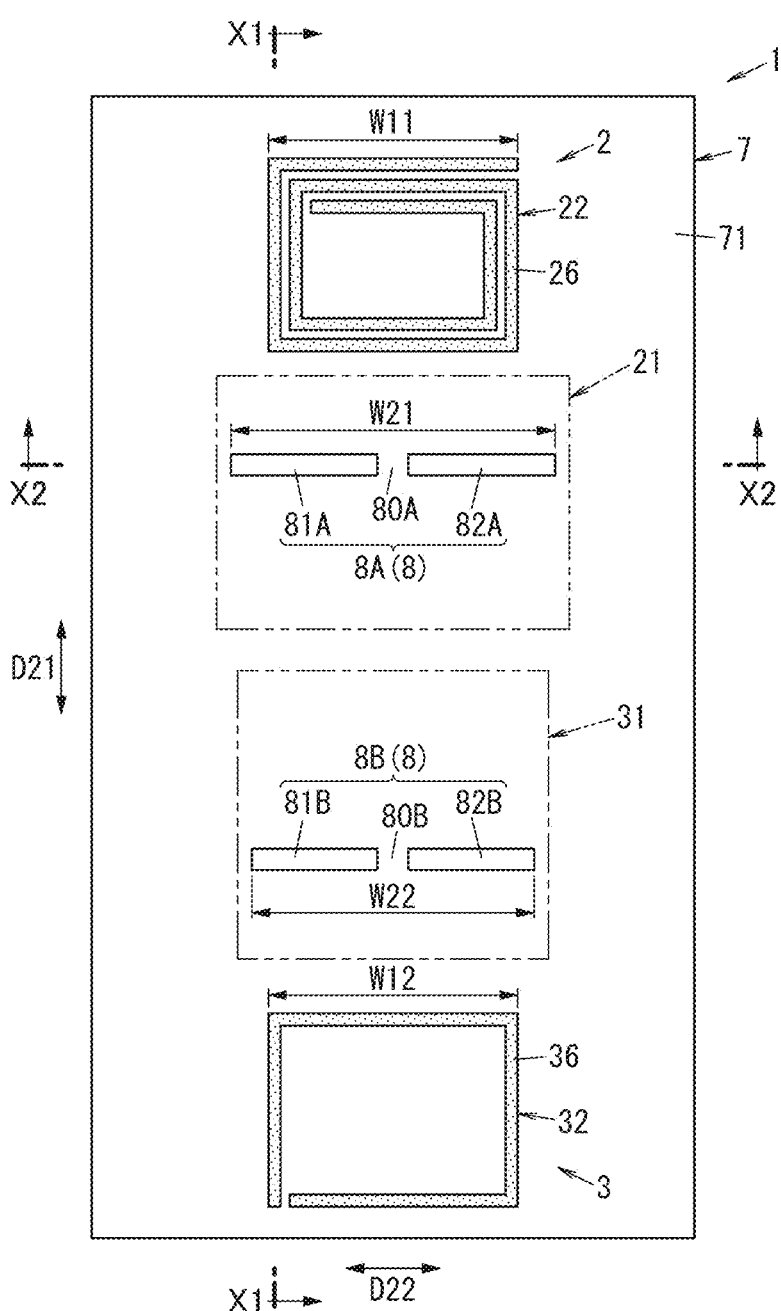
FIG. 1 is a plan view of a radio-frequency module according to Embodiment 1.
Figure 2:
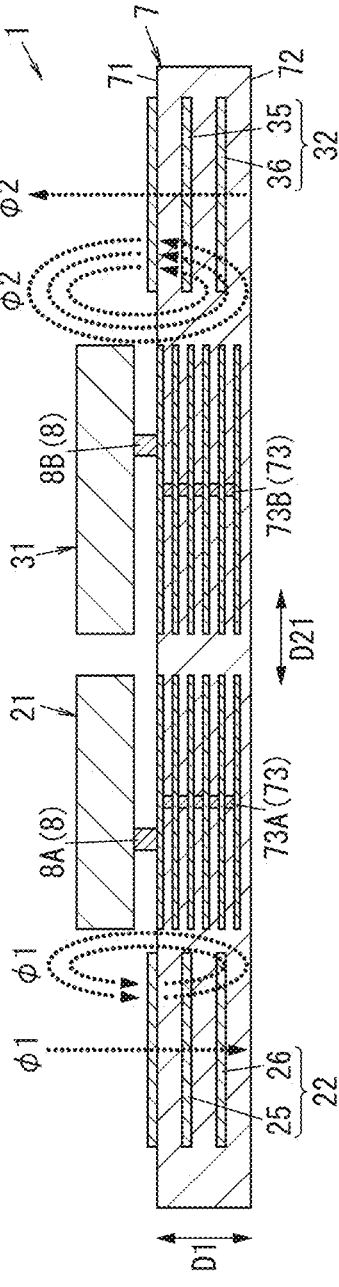
FIG. 2 is a cross-sectional view taken along line X1-X1 of FIG. 1 in the radio-frequency module described above.
Figure 3:
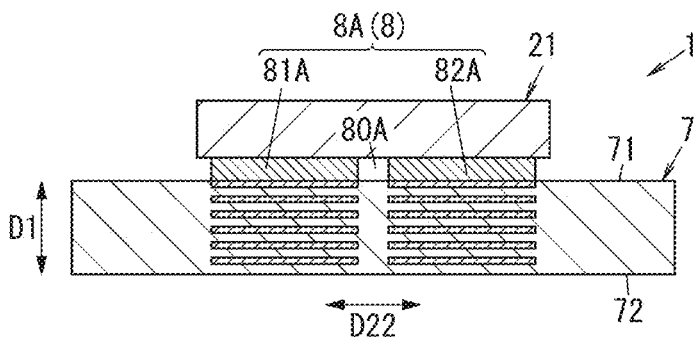
FIG. 3 is a cross-sectional view taken along line X2-X2 of FIG. 1 in the radio-frequency module described above.

The radio-frequency module 1 includes, as illustrated in FIGS. 1 to 3, the first power amplifier circuit 2, the second power amplifier circuit 3, a substrate 7, and a plurality of (for example, two in the figures) long bumps 8.

The substrate 7 has a first main surface (one main surface) 71 and a second main surface 72 as illustrated in FIGS. 1 to 3. The first main surface 71 and the second main surface 72 face each other in a thickness direction D1 of the substrate 7.

The plurality of long bumps 8 include a first long bump 8A and a second long bump 8B as illustrated in FIGS. 1 and 3. The plurality of long bumps 8 are disposed on the first main surface 71 of the substrate 7.

The first long bump 8A includes, as illustrated in FIGS. 1 and 2, a plurality of (for example, two in the figures) bumps 81A and 82A. The plurality of bumps 81A and 82A are arranged along a second direction D22. The plurality of bumps 81A and 82A are long in shape and are disposed so that their longitudinal directions are along the second direction D22. The first long bump 8A has a gap 80A. The gap 80A is located between the bump 81A and the bump 82A in the second direction D22.

The second long bump 8B includes, as illustrated in FIGS. 1 and 2, a plurality of (for example, two in the figures) bumps 81B and 82B. The plurality of bumps 81B and 82B are arranged along the second direction D22. The plurality of bumps 81B and 82B are long in shape and are disposed so that their longitudinal directions are along the second direction D22. The second long bump 8B has a gap 80B. The gap 80B is located between the bump 81B and the bump 82B in the second direction D22.

First, the layout of the first power amplifier circuit 2 will be described. As illustrated in FIGS. 1 to 3, the first amplifier component 21 and the first output transformer 22 are disposed in, on, or above the substrate 7.

The first amplifier component 21 is disposed on the first main surface 71 of the substrate 7 with the long bump 8 interposed between the first amplifier component 21 and the first main surface 71. The first amplifier element 23 and the second amplifier element 24 that are illustrated in FIG. 4 are integrated into a single chip as the first amplifier component 21. That is, the first amplifier component 21 includes the first amplifier element 23 and the second amplifier element 24 (see FIG. 4). The first amplifier element 23 and the second amplifier element 24 are disposed within the first amplifier component 21.

The first coil 25 of the first output transformer 22 is formed within the substrate 7 as illustrated in FIG. 2. As illustrated in FIGS. 1 and 2, part of the second coil 26 of the first output transformer 22 is formed within the substrate 7, and the rest is formed on the first main surface 71 of the substrate 7. Assuming that, of both ends of the second coil 26, the first end near the output terminal 27 (see FIG. 4) is a starting point, the second coil 26 is wound counterclockwise. The second coil 26 is disposed so as to overlap the first coil 25 when viewed in plan in the thickness direction D1 of the substrate 7.

Next, the layout of the second power amplifier circuit 3 will be described. As illustrated in FIGS. 1 and 2, the second amplifier component 31 and the second output transformer 32 are disposed in, on, or above the substrate 7.

The second amplifier component 31 is disposed on the first main surface 71 of the substrate 7 with the long bump 8 interposed between the second amplifier component 31 and the first main surface 71. The third amplifier element 33 and the fourth amplifier element 34 that are illustrated in FIG. 4 are integrated into a single chip as the second amplifier component 31. That is, the second amplifier component 31 includes the third amplifier element 33 and the fourth amplifier element 34 (see FIG. 4). The third amplifier element 33 and the fourth amplifier element 34 are disposed within the second amplifier component 31.

The third coil 35 of the second output transformer 32 is formed within the substrate 7 as illustrated in FIG. 2. As illustrated in FIGS. 1 and 2, part of the fourth coil 36 of the second output transformer 32 is formed within the substrate 7, and the rest is formed on the first main surface 71 of the substrate 7. Assuming that, of both ends of the fourth coil 36, the first end near the output terminal 37 (see FIG. 4) is a starting point, the fourth coil 36 is wound clockwise. The fourth coil 36 is disposed so as to overlap the third coil 35 when viewed in plan in the thickness direction D1 of the substrate 7.

The second coil 26 of the first output transformer 22 and the fourth coil 36 of the second output transformer 32 are disposed so that directions of magnetic fluxes that are generated when a current flows therethrough differ from each other. For example, the second coil 26 of the first output transformer 22 is disposed in or on the substrate 7 so that a magnetic flux φ1 generated at a center is directed from a first main surface 71 side to a second main surface 72 side. The fourth coil 36 of the second output transformer 32 is disposed in or on the substrate 7 so that a magnetic flux φ2 generated at a center is directed from the second main surface 72 side to the first main surface 71 side.

In FIG. 2, the direction of the magnetic flux φ1 generated when a current flows through the second coil 26 of the first output transformer 22 is a counterclockwise direction, and the direction of the magnetic flux φ2 generated when a current flows through the fourth coil 36 of the second output transformer 32 is a clockwise direction. When the first transmission signal is input to the first output transformer 22, that is, when a current is input to the first output transformer 22, the magnetic flux φ1 is generated from the first main surface 71 side to the second main surface 72 side in the first output transformer 22. When the second transmission signal is input to the second output transformer 32, that is, when a current is input to the second output transformer 32, the magnetic flux φ2 is generated from the second main surface 72 side to the first main surface 71 side in the second output transformer 32. That is, the first output transformer 22 and the second output transformer 32 are configured so that the directions of magnetic fluxes that are generated when transmission signals (first transmission signal, second transmission signal) are input thereto differ from each other.

As illustrated in FIG. 1, the plurality of long bumps 8 are located between the first output transformer 22 and the second output transformer 32 when viewed in plan in the thickness direction D1 of the substrate 7. More particularly, the first long bump 8A and the second long bump 8B are located between the first output transformer 22 and the second output transformer 32 in a first direction D21 orthogonal to the thickness direction D1 of the substrate 7. Specifically, in the first direction D21, the first long bump 8A is located between the first output transformer 22 and the second long bump 8B, and the second long bump 8B is located between the second output transformer 32 and the first long bump 8A.

Here, the long bumps 8 refer to bumps of a long shape. A long shape refers to a shape elongated in one direction, and a long direction refers to this one direction. More specifically, the long shape refers to a shape in which a length in the one direction is longer than a length in another direction intersecting this one direction.

Thus, the long bumps 8 can reduce the entry of the magnetic flux φ1 from the first output transformer 22 to a second output transformer 32 side. Similarly, the long bumps 8 can reduce the entry of the magnetic flux φ2 from the second output transformer 32 to a first output transformer 22 side. As a result, deterioration of characteristics can be reduced.

Incidentally, a width W21 of the first long bump 8A is wider than a width W11 of the second coil 26 of the first output transformer 22. In other words, in the second direction D22, a length of the first long bump 8A is longer than a length of the second coil 26 of the first output transformer 22. This can further block the magnetic flux φ1 (see FIG. 2) from the second coil 26 of the first output transformer 22 and thus can further reduce deterioration of characteristics.

Similarly, a width W22 of the second long bump 8B is wider than a width W12 of the fourth coil 36 of the second output transformer 32. In other words, in the second direction D22, a length of the second long bump 8B is longer than a length of the fourth coil 36 of the second output transformer 32. This can further block the magnetic flux φ2 (see FIG. 2) from the fourth coil 36 of the second output transformer 32 and thus can further reduce deterioration of characteristics.

Furthermore, as illustrated in FIG. 2, the substrate 7 includes a plurality of (for example, two in the figure)

thermal vias 73. The plurality of thermal vias 73 include a first thermal via 73A and a second thermal via 73B. The first thermal via 73A is electrically connected to the first amplifier component 21 and is disposed so as to overlap the first amplifier component 21 when viewed in plan in the thickness direction D1 of the substrate 7. The second thermal via 73B is electrically connected to the second amplifier component 31 and is disposed so as to overlap the second amplifier component 31 when viewed in plan in the thickness direction D1 of the substrate 7.

In the second direction D22, a width of the first thermal via 73A is wider than the width W11 of the second coil 26 of the first output transformer 22. In other words, in the second direction D22, a length of the first thermal via 73A is longer than the length of the second coil 26 of the first output transformer 22. As a result, the first thermal via 73A can reduce the entry of the magnetic flux φ1 from the first output transformer 22 to the second output transformer 32 side within the substrate 7 as well, and thus deterioration of characteristics can be further reduced.

Similarly, in the second direction D22, a width of the second thermal via 73B is wider than the width W12 of the fourth coil 36 of the second output transformer 32. In other words, in the second direction D22, a length of the second thermal via 73B is longer than the length of the fourth coil 36 of the second output transformer 32. As a result, the second thermal via 73B can reduce the entry of the magnetic flux φ2 from the second output transformer 32 to the first output transformer 22 side within the substrate 7 as well, and thus deterioration of characteristics can be further reduced.

As described above, the first output transformer 22 and the second output transformer 32 differ from each other in winding direction when viewed in plan in the thickness direction D1 of the substrate 7.

Thus, the influence of the magnetic flux φ1 from the first output transformer 22 in the second output transformer 32 can be reduced. Similarly, the influence of the magnetic flux φ2 from the second output transformer 32 in the first output transformer 22 can be reduced.

Incidentally, as illustrated in FIGS. 1 and 2, the first output transformer 22, the first amplifier component 21, the second amplifier component 31, and the second output transformer 32 are arranged in this order when viewed in plan in the thickness direction D1 of the substrate 7. More particularly, the first output transformer 22, the first amplifier component 21, the second amplifier component 31, and the second output transformer 32 are arranged in this order in the first direction D21 orthogonal to the thickness direction D1 of the substrate 7.

Thus, since the first output transformer 22 and the second output transformer 32 can be kept away from each other, the influence of the magnetic flux φ1 from the first output transformer 22 in the second output transformer 32 can be further reduced. Similarly, the influence of the magnetic flux φ2 from the second output transformer 32 in the first output transformer 22 can be further reduced.

Incidentally, the long bump 8 (first long bump 8A) does not overlap a central portion of the first output transformer 22 when viewed in plan in the thickness direction D1 of the substrate 7. Also, the long bump 8 (second long bump 8B) does not overlap a central portion of the second output transformer 32 when viewed in plan in the thickness direction D1 of the substrate 7. Furthermore, in the example of FIG. 1, the first long bump 8A does not overlap the center of the first amplifier component 21 when viewed in plan in the thickness direction D1 of the substrate 7. The second long bump 8B does not overlap the center of the second amplifier component 31 when viewed in plan in the thickness direction D1 of the substrate 7.

(5) Example of Operation of Radio-Frequency Module

The operation of the radio-frequency module 1 in a case where simultaneous communication is performed will be described below with reference to FIG. 5.

In the case where simultaneous communication is performed, the switch 6 puts the first antenna terminal 51 and the first transmission filter 41 into a state in which they are connected to each other and puts the second antenna terminal 52 and the second transmission filter 42 into a state in which they are connected to each other. That is, the switch 6 selects, as a connection destination of the common terminal 61, the selection terminal 63 and selects, as a connection destination of the common terminal 62, the selection terminal 64.

A first transmission signal output from the signal processing circuit 92 is transmitted from the first antenna 911 through the first power amplifier circuit 2 and the first transmission filter 41. A second transmission signal output from the signal processing circuit 92 is transmitted from the second antenna 912 through the second power amplifier circuit 3 and the second transmission filter 42.

(6) Effects

In the radio-frequency module 1 according to Embodiment 1, the long bumps 8 are located between the first output transformer 22 and the second output transformer 32 when viewed in plan in the thickness direction D1 of the substrate 7. As a result, the long bumps 8 can reduce the entry of the magnetic flux φ1 from the first output transformer 22 to the second output transformer 32 side, and thus deterioration of characteristics can be reduced. Similarly, the long bumps 8 can reduce the entry of the magnetic flux φ2 from the second output transformer 32 to the first output transformer 22 side, and thus deterioration of characteristics can be reduced.

In the radio-frequency module 1 according to Embodiment 1, the width W21 of the long bump 8 (first long bump 8A) is wider than the width W11 of the second coil 26 of the first output transformer 22. This can further reduce the entry of the magnetic flux φ1 from the second coil 26 of the first output transformer 22 to the second output transformer 32 side and thus can further reduce deterioration of characteristics. Similarly, the width W22 of the long bump 8 (second long bump 8B) is wider than the width W12 of the fourth coil 36 of the second output transformer 32. This can further reduce the entry of the magnetic flux φ2 from the fourth coil 36 of the second output transformer 32 to the first output transformer 22 side and thus can further reduce deterioration of characteristics.

In the radio-frequency module 1 according to Embodiment 1, the width of the thermal via 73 (first thermal via 73A) in the substrate 7 is wider than the width W11 of the second coil 26 of the first output transformer 22. As a result, the thermal via 73 can reduce the entry of the magnetic flux φ1 from the first output transformer 22 to the second output transformer 32 side within the substrate 7 as well, and thus deterioration of characteristics can be further reduced. Similarly, the width of the thermal via 73 (second thermal via 73B) in the substrate 7 is wider than the width W12 of the fourth coil 36 of the second output transformer 32. As a result, the thermal via 73 can reduce the entry of the magnetic flux φ2 from the second output transformer 32 to the first output transformer 22 side within the substrate 7 as well, and thus deterioration of characteristics can be further reduced.

In the radio-frequency module 1 according to Embodiment 1, the first output transformer 22 and the second output transformer 32 differ from each other in winding direction when viewed in plan in the thickness direction D1 of the substrate 7. Thus, the influence of the magnetic flux φ1 from the first output transformer 22 in the second output transformer 32 can be reduced. Similarly, the influence of the magnetic flux φ2 from the second output transformer 32 in the first output transformer 22 can be reduced.

In the radio-frequency module 1 according to Embodiment 1, the first output transformer 22, the first amplifier component 21, the second amplifier component 31, and the second output transformer 32 are arranged in this order when viewed in plan in the thickness direction D1 of the substrate 7. Thus, since the first output transformer 22 and the second output transformer 32 can be kept away from each other, the influence of the magnetic flux φ1 from the first output transformer 22 in the second output transformer 32 can be further reduced. Similarly, the influence of the magnetic flux φ2 from the second output transformer 32 in the first output transformer 22 can be further reduced.

(7) Modification

A modification of Embodiment 1 will be described below.

As a modification of Embodiment 1, the first output transformer 22 and the second output transformer 32 may be identical in winding direction when viewed in plan in the thickness direction D1 of the substrate 7.

In the radio-frequency module 1 according to the modification, winding directions of the first output transformer 22 and the second output transformer 32 are identical when viewed in plan in the thickness direction D1 of the substrate 7. This further increases the effect in which the long bumps 8 reduce the entry of magnetic fluxes (the magnetic flux φ1 from the first output transformer 22, the magnetic flux φ2 from the second output transformer 32).

The radio-frequency module 1 according to the above-described modification also achieves an effect similar to that achieved by the radio-frequency module 1 according to Embodiment 1.

Embodiment 2

Figure 7:
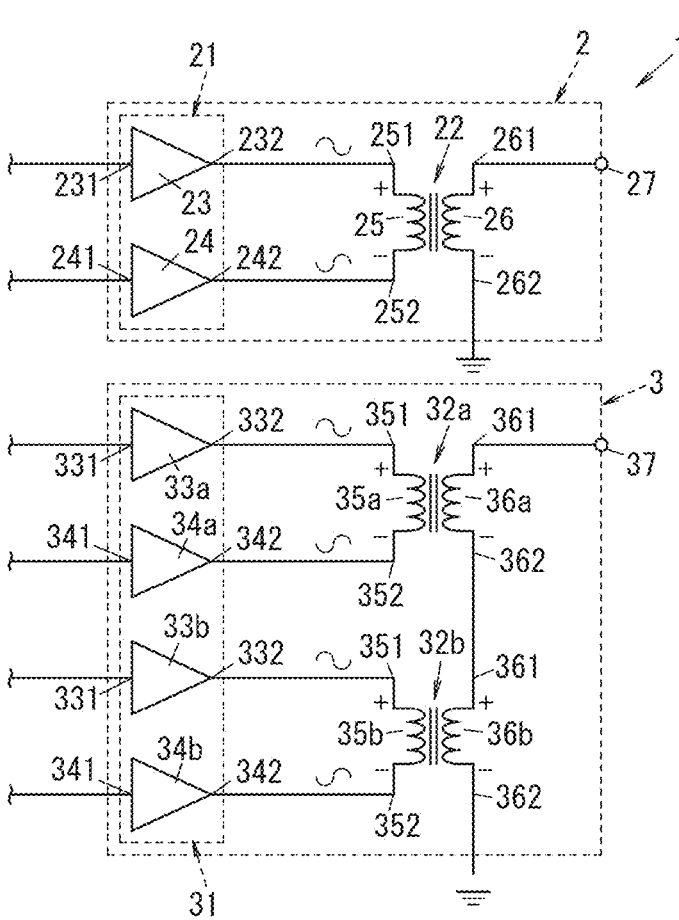
FIG. 7 is a circuit diagram of a main section of the radio-frequency module described above.

The radio-frequency module 1 according to Embodiment 2 differs from the radio-frequency module 1 according to Embodiment 1 (see FIG. 4) in that the second power amplifier circuit 3 is a Doherty amplifier circuit as illustrated in FIG. 7.

(1) Configuration

Figure 6:
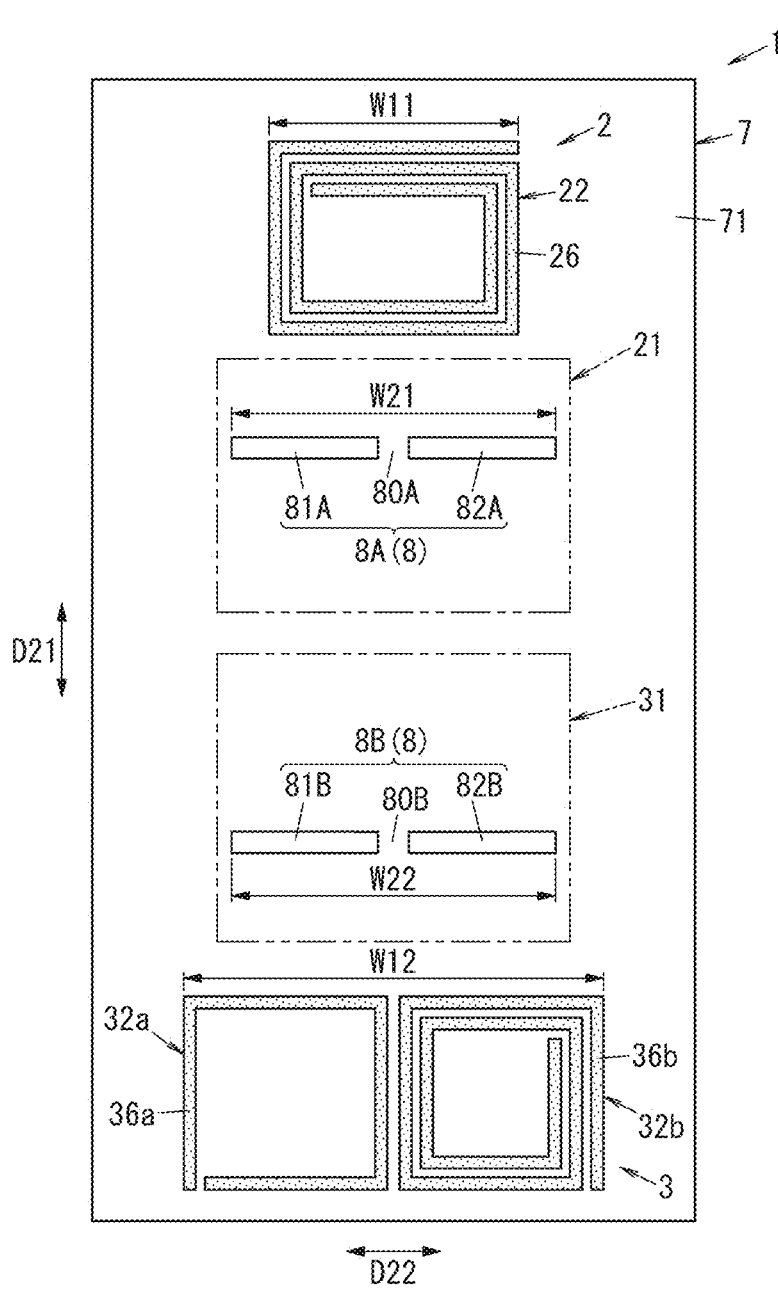
FIG. 6 is a plan view of the radio-frequency module according to Embodiment 2.

The radio-frequency module 1 according to Embodiment 2 includes, as illustrated in FIGS. 6 and 7, the first power amplifier circuit 2 and the second power amplifier circuit 3. In the radio-frequency module 1 according to Embodiment 2, note that components similar to those in the radio-frequency module 1 according to Embodiment 1 are denoted by the same reference signs, and a description thereof is omitted.

The second power amplifier circuit 3 in Embodiment 2 is a Doherty amplifier circuit. The second power amplifier circuit 3 includes the second amplifier component 31, and a plurality of (for example, two in the figures) second output transformers 32a and 32b.

The second amplifier component 31 includes a plurality of third amplifier elements 33a and 33b, and a plurality of fourth amplifier elements 34a and 34b. The second output transformer 32a includes a third coil 35a and a fourth coil 36a. The second output transformer 32b includes a third coil 35b and a fourth coil 36b.

(2) Operation

Next, the operation of the radio-frequency module 1 according to Embodiment 2 will be described with reference to FIGS. 6 and 7.

(2.1) First Operation

During first operation of the radio-frequency module 1, all of the third amplifier elements 33a and 33b and the fourth amplifier elements 34a and 34b are operating. At this time, a power level of the second transmission signal (non-inverted input signal) input to the third amplifier element 33b and a power level of the second transmission signal (inverted input signal) input to the fourth amplifier element 34b are not less than a reference power level. That is, when the power level of the second transmission signal input to the third amplifier element 33b reaches or exceeds the reference power level, the third amplifier element 33b amplifies and outputs the second transmission signal. Furthermore, when the power level of the second transmission signal input to the fourth amplifier element 34b reaches or exceeds the reference power level, the fourth amplifier element 34b amplifies and outputs the second transmission signal. On the other hand, regardless of a power level of the second transmission signal (non-inverted input signal) input to the third amplifier element 33a, the third amplifier element 33a amplifies and outputs the second transmission signal. Furthermore, regardless of a power level of the second transmission signal (inverted input signal) input to the fourth amplifier element 34a, the fourth amplifier element 34a amplifies and outputs the second transmission signal.

Here, a phase of the second transmission signal (non-inverted input signal) output from the third amplifier element 33b is opposite to a phase of the second transmission signal (inverted input signal) output from the fourth amplifier element 34b. Furthermore, a phase of the second transmission signal (non-inverted input signal) output from the third amplifier element 33a is opposite to a phase of the second transmission signal (inverted input signal) output from the fourth amplifier element 34a. For this reason, a primary voltage applied to the third coil 35a of the second output transformer 32a and a primary voltage applied to the third coil 35b of the second output transformer 32b are twice a voltage of the second transmission signal.

Hence, a secondary voltage applied to the fourth coil 36a of the second output transformer 32a is the product of the primary voltage applied to the third coil 35a and a turns ratio of the second output transformer 32a. A secondary voltage applied to the fourth coil 36b of the second output transformer 32b is the product of the primary voltage applied to the third coil 35b and a turns ratio of the second output transformer 32b.

(2.2) Second Operation

During second operation of the radio-frequency module 1, power input to the third amplifier element 33b and the fourth amplifier element 34b decreases, and power output from the third amplifier element 33b and the fourth amplifier element 34b approaches zero. In the radio-frequency module 1 according to Embodiment 2, a A/4 line is provided in a signal path to which the third amplifier element 33b is connected, a A/4 line is provided in a signal path to which the fourth amplifier element 34b is connected, and thus both ends of the third coil 35b of the second output transformer 32b are short-circuited. At this time, impedance of the third amplifier element 33b is large at all times, and thus the third amplifier element 33b is put into a state in which it is separated from the signal path. Furthermore, impedance of the fourth amplifier element 34b is large at all times, and thus the fourth amplifier element 34b is put into a state in which it is separated from the signal path.

At this time, a primary voltage applied to the third coil 35a of the second output transformer 32a is twice a voltage of the second transmission signal.

Hence, a secondary voltage applied to the fourth coil 36a of the second output transformer 32a is the product of the primary voltage applied to the third coil 35a and a turns ratio of the second output transformer 32a.

Impedance of the third amplifier element 33a during the second operation is twice impedance of the third amplifier element 33a during the first operation. Furthermore, impedance of the fourth amplifier element 34a during the second operation is twice impedance of the fourth amplifier element 34b during the first operation. Hence, during the second operation, amplification efficiency of the radio-frequency module 1 can be improved in comparison with that during the first operation. That is, the radio-frequency module 1 according to Embodiment 2 can reduce a reduction in amplification efficiency.

(3) Effects

In the radio-frequency module 1 according to Embodiment 2, the second power amplifier circuit 3 is a Doherty amplifier circuit. Thus, in the Doherty amplifier circuit as well, deterioration of characteristics can be reduced.

Embodiment 3

Figure 8:
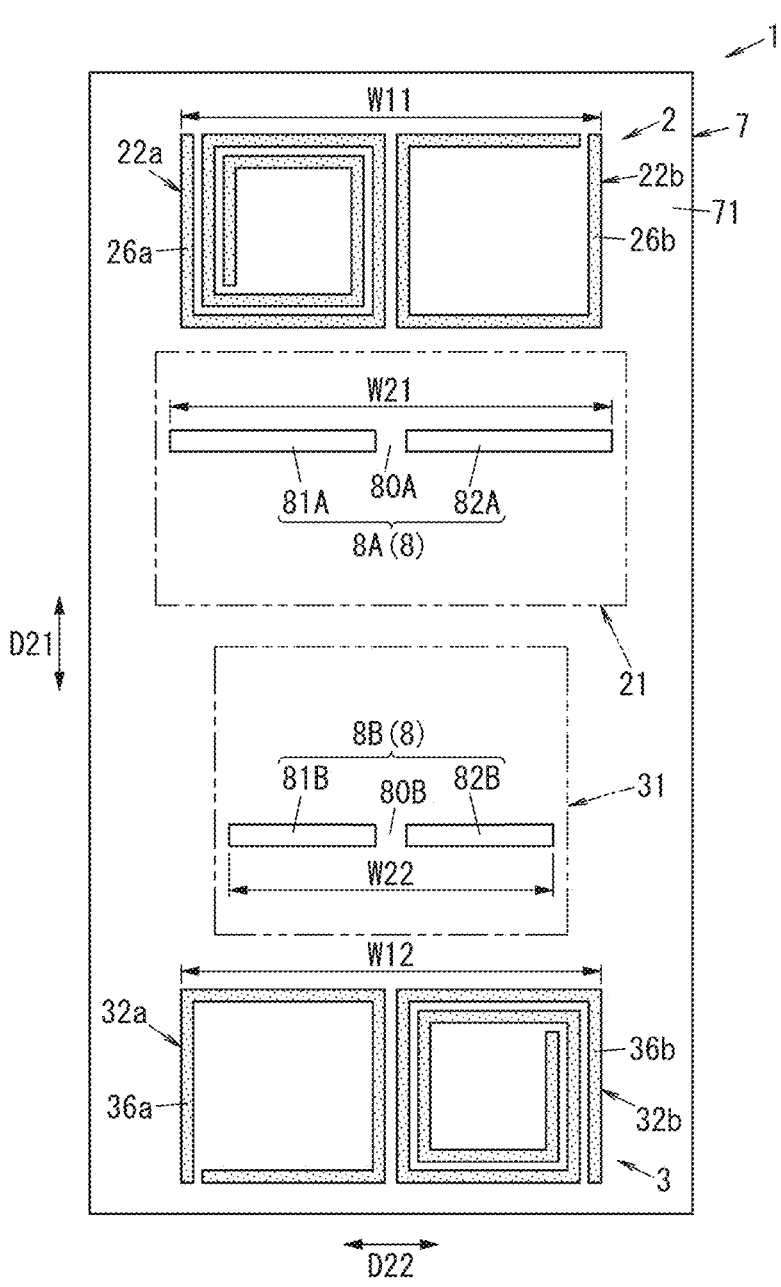
FIG. 8 is a plan view of the radio-frequency module according to Embodiment 3.

The radio-frequency module 1 according to Embodiment 3 differs from the radio-frequency module 1 according to Embodiment 2 (see FIG. 6) in that both of the first power amplifier circuit 2 and the second power amplifier circuit 3 are Doherty circuits as illustrated in FIG. 8.

(1) Configuration

The radio-frequency module 1 according to Embodiment 3 includes, as illustrated in FIG. 8, the first power amplifier circuit 2 and the second power amplifier circuit 3. In the radio-frequency module 1 according to Embodiment 3, note that components similar to those in the radio-frequency module 1 according to Embodiment 2 are denoted by the same reference signs, and a description thereof is omitted.

The first power amplifier circuit 2 in Embodiment 3 is a Doherty amplifier circuit. The first power amplifier circuit 2 includes the first amplifier component 21, and a plurality of (for example, two in the figure) first output transformers 22a and 22b.

The first amplifier component 21 includes a plurality of first amplifier elements 23 and a plurality of second amplifier elements 24 (see FIG. 7). The first output transformer 22a includes the first coil 25 (see FIG. 2) and a second coil 26a. The first output transformer 22b includes the first coil 25 (see FIG. 2) and a second coil 26b.

(2) Effects

In the radio-frequency module 1 according to Embodiment 3, the first power amplifier circuit 2 and the second power amplifier circuit 3 are Doherty amplifier circuits. Thus, in the Doherty amplifier circuits as well, deterioration of characteristics can be reduced.

Embodiment 4

Figure 9:
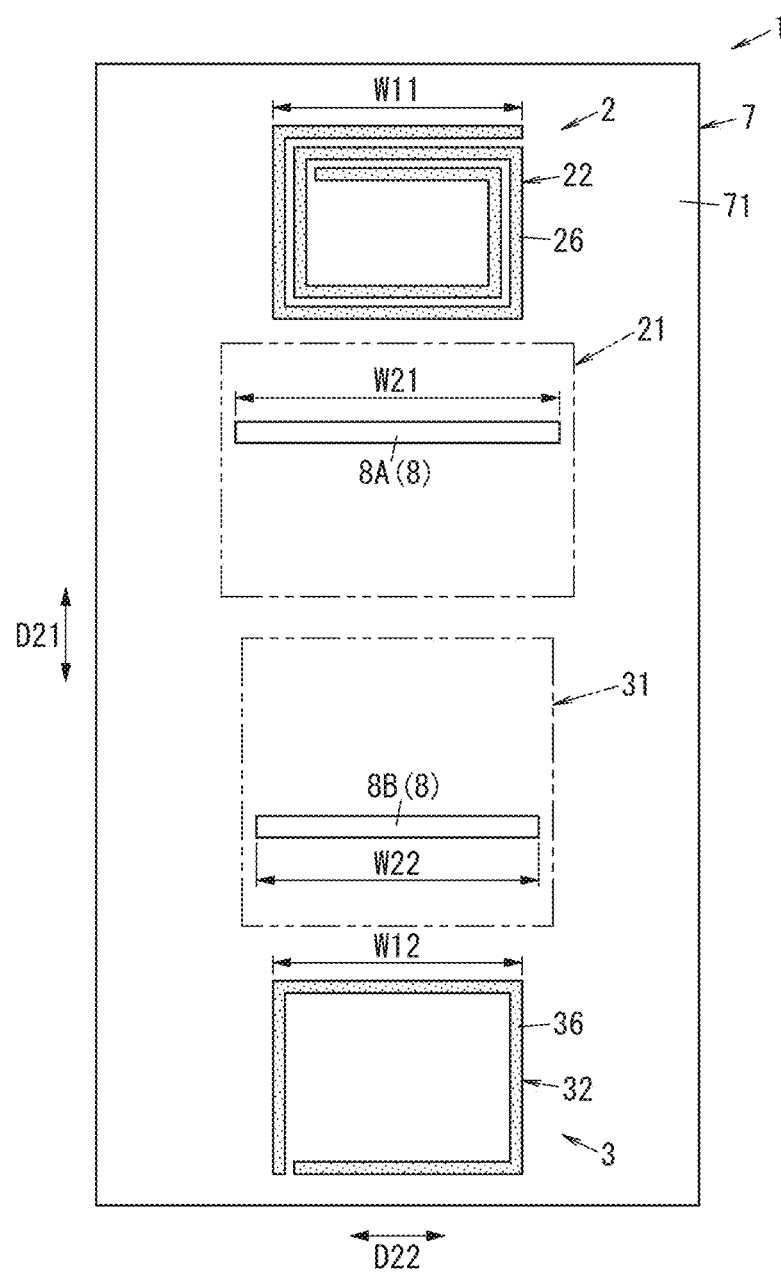
FIG. 9 is a plan view of the radio-frequency module according to Embodiment 4.

The radio-frequency module 1 according to Embodiment 4 differs from the radio-frequency module 1 according to Embodiment 1 (see FIG. 1) in that each of the plurality of long bumps 8 is one bump as illustrated in FIG. 9.

(1) Configuration

The radio-frequency module 1 according to Embodiment 4 includes, as illustrated in FIG. 9, the first power amplifier circuit 2, the second power amplifier circuit 3, the substrate 7, and the plurality of (for example, two in the figure) long bumps 8. In the radio-frequency module 1 according to Embodiment 4, note that components similar to those in the radio-frequency module 1 according to Embodiment 1 are denoted by the same reference signs, and a description thereof is omitted.

Each of the plurality of long bumps 8 in Embodiment 4 is constituted by one bump. As for the long bumps 8 in Embodiment 4, note that a description of configurations and functions similar to those of the long bumps 8 in Embodiment 1 (see FIG. 1) is omitted.

(2) Effects

In the radio-frequency module 1 according to Embodiment 4, as in Embodiment 1, the long bumps 8 are located between the first output transformer 22 and the second output transformer 32 when viewed in plan in the thickness direction D1 of the substrate 7. As a result, the long bumps 8 can reduce the entry of a magnetic flux from the first output transformer 22, and thus deterioration of characteristics can be reduced. Similarly, the long bumps 8 can reduce the entry of a magnetic flux from the second output transformer 32, and thus deterioration of characteristics can be reduced.

Embodiment 5

Figure 10:
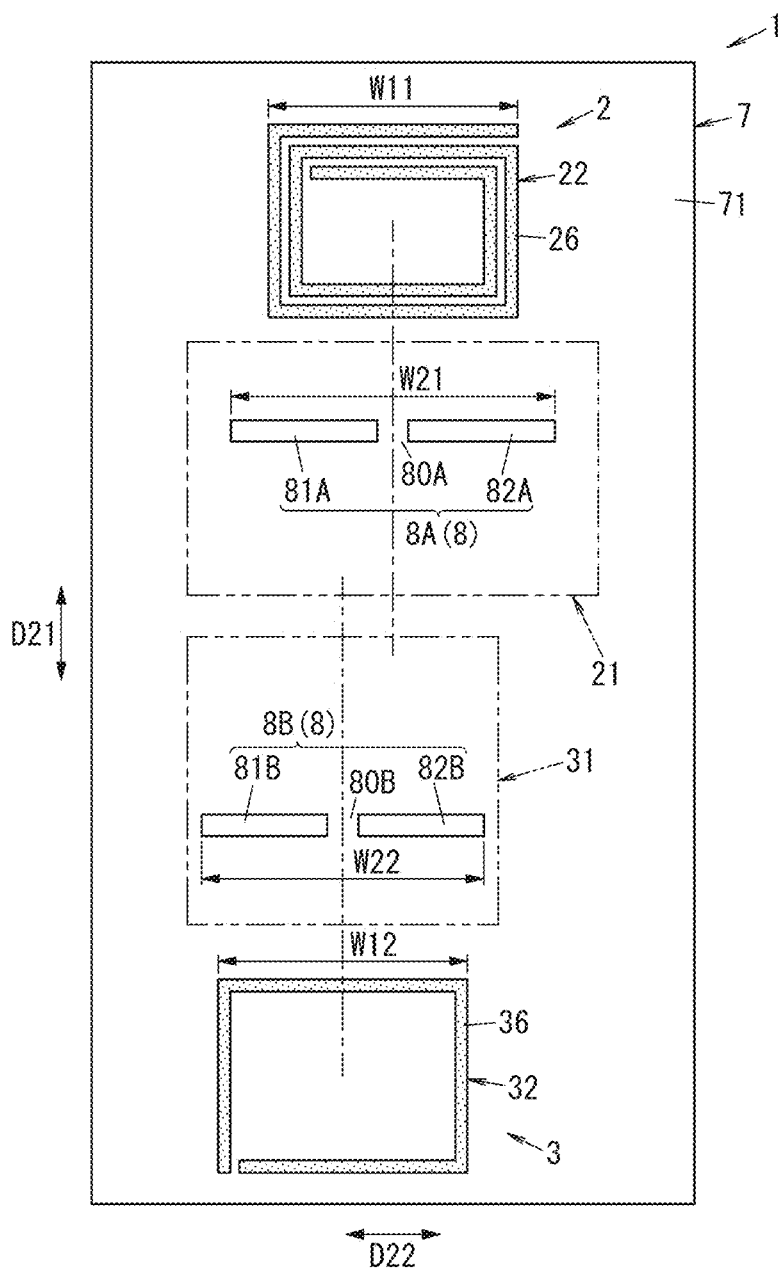
FIG. 10 is a plan view of the radio-frequency module according to Embodiment 5.

The radio-frequency module 1 according to Embodiment 5 differs from the radio-frequency module 1 according to Embodiment 1 (see FIG. 1) in that the gap 80A of the first long bump 8A and the gap 80B of the second long bump 8B are displaced as illustrated in FIG. 10.

(1) Configuration

The radio-frequency module 1 according to Embodiment 5 includes, as illustrated in FIG. 10, the first power amplifier circuit 2, the second power amplifier circuit 3, the substrate 7, and the plurality of (for example, two in the figure) long bumps 8. In the radio-frequency module 1 according to Embodiment 5, note that components similar to those in the radio-frequency module 1 according to Embodiment 1 are denoted by the same reference signs, and a description thereof is omitted.

In Embodiment 5, the gap 80A of the first long bump 8A and the gap 80B of the second long bump 8B are displaced. In other words, the gap 80A of the first long bump 8A and the gap 80B of the second long bump 8B are not arranged in a straight line in the first direction D21. As for the long bumps 8 in Embodiment 5, note that a description of configurations and functions similar to those of the long bumps 8 in Embodiment 1 (see FIG. 1) is omitted.

In Embodiment 5, the center of the first output transformer 22 and the center of the second output transformer 32 are not arranged in a straight line in the first direction D21. As for the first power amplifier circuit 2 and the second power amplifier circuit 3 in Embodiment 5, note that a description of configurations and functions similar to those of the first power amplifier circuit 2 and the second power amplifier circuit 3 in Embodiment 1 (see FIG. 1) is omitted.

(2) Effects

In the radio-frequency module 1 according to Embodiment 5, as in Embodiment 1, the long bumps 8 are located between the first output transformer 22 and the second output transformer 32 when viewed in plan in the thickness direction D1 of the substrate 7. As a result, the long bumps 8 can reduce the entry of a magnetic flux from the first output transformer 22, and thus deterioration of characteristics can be reduced. Similarly, the long bumps 8 can reduce the entry of a magnetic flux from the second output transformer 32, and thus deterioration of characteristics can be reduced.

Embodiment 6

Figure 11:
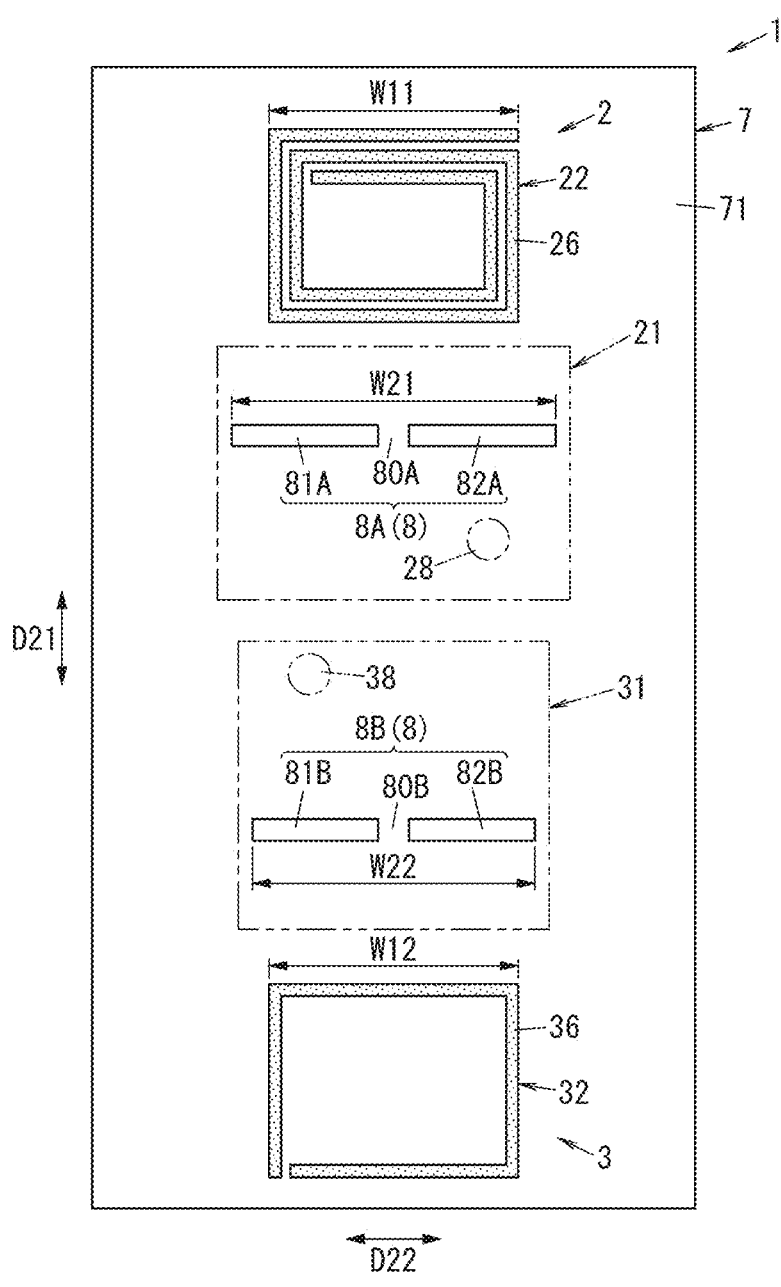
FIG. 11 is a plan view of the radio-frequency module according to Embodiment 6.

The radio-frequency module 1 according to Embodiment 6 differs from the radio-frequency module according to Embodiment 1 (see FIG. 1) in that an input terminal 28 of the first amplifier component 21 and an input terminal 38 of the second amplifier component 31 are disposed between the first long bump 8A and the second long bump 8B as illustrated in FIG. 11.

(1) Configuration

The radio-frequency module 1 according to Embodiment 6 includes, as illustrated in FIG. 11, the first power amplifier circuit 2, the second power amplifier circuit 3, the substrate 7, and the plurality of (for example, two in the figure) long bumps 8. In the radio-frequency module 1 according to Embodiment 6, note that components similar to those in the radio-frequency module 1 according to Embodiment 1 are denoted by the same reference signs, and a description thereof is omitted.

The first power amplifier circuit 2 includes the first amplifier component 21 and the first output transformer 22. In Embodiment 6, the input terminal 28 of the first amplifier component 21 is located opposite the first output transformer 22 with the first long bump 8A interposed between the input terminal 28 and the first output transformer 22 in the first direction D21. In other words, the first long bump 8A is located between the input terminal 28 of the first amplifier component 21 and the first output transformer 22 when viewed in plan in the thickness direction D1 of the substrate 7. As for the first power amplifier circuit 2 in Embodiment 6, note that a description of a configuration and a function similar to those of the first power amplifier circuit 2 in Embodiment 1 (see FIG. 1) is omitted.

The second power amplifier circuit 3 includes the second amplifier component 31 and the second output transformer 32. In Embodiment 6, the input terminal 38 of the second amplifier component 31 is located opposite the second output transformer 32 with the second long bump 8B interposed between the input terminal 38 and the second output transformer 32 in the first direction D21. In other words, the second long bump 8B is located between the input terminal 38 of the second amplifier component 31 and the second output transformer 32 when viewed in plan in the thickness direction D1 of the substrate 7. As for the second power amplifier circuit 3 in Embodiment 6, note that a description of a configuration and a function similar to those of the second power amplifier circuit 3 in Embodiment 1 (see FIG. 1) is omitted.

(2) Effects

In the radio-frequency module 1 according to Embodiment 6, the long bump 8 (first long bump 8A) is located between the input terminal 28 of the first amplifier component 21 and the first output transformer 22 when viewed in plan in the thickness direction D1 of the substrate 7. Thus, the influence of the first transmission signal at the input terminal 28 of the first amplifier component 21 can be reduced. Similarly, the long bump 8 (second long bump 8B) is located between the input terminal 38 of the second amplifier component 31 and the second output transformer 32 when viewed in plan in the thickness direction D1 of the substrate 7. Thus, the influence of the second transmission signal at the input terminal 38 of the second amplifier component 31 can be reduced.

Embodiment 7

Figure 12:
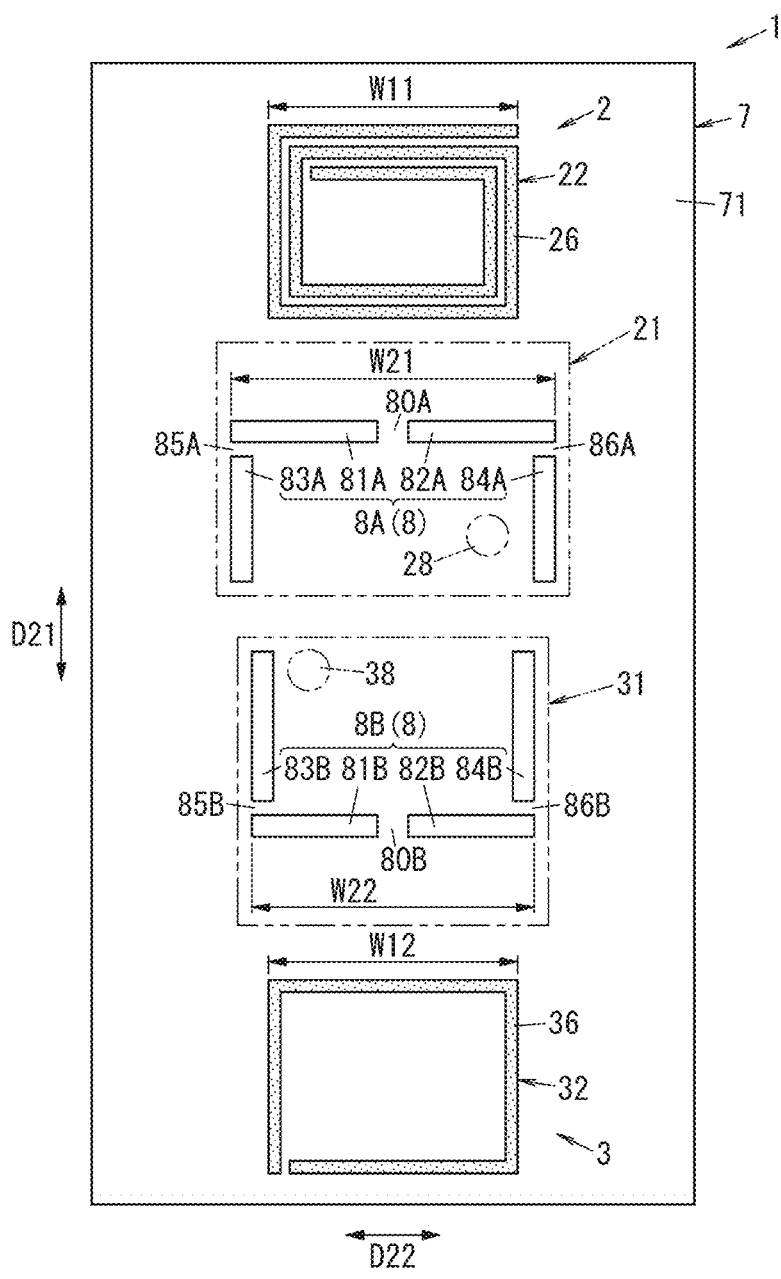
FIG. 12 is a plan view of the radio-frequency module according to Embodiment 7.

The radio-frequency module 1 according to Embodiment 7 differs from the radio-frequency module 1 according to Embodiment 6 (see FIG. 11) in that the plurality of long bumps 8 are included as illustrated in FIG. 12.

(1) Configuration

The radio-frequency module 1 according to Embodiment 7 includes, as illustrated in FIG. 12, the first power amplifier circuit 2, the second power amplifier circuit 3, the substrate 7, and the plurality of (for example, two in the figure) long bumps 8. In the radio-frequency module 1 according to Embodiment 7, note that components similar to those in the radio-frequency module 1 according to Embodiment 6 are denoted by the same reference signs, and a description thereof is omitted.

The plurality of long bumps 8 include the first long bump 8A and the second long bump 8B. As for the long bumps 8 in Embodiment 7, note that a description of configurations and functions similar to those of the long bumps 8 in Embodiment 6 (see FIG. 11) is omitted.

The first long bump 8A includes four bumps 81A to 84A. Two bumps 81A and 82A are arranged along the second direction D22. The two bumps 81A and 82A are disposed so that their longitudinal directions are along the second direction D22. Two bumps 83A and 84A are disposed so that their longitudinal directions are along the first direction D21. The first long bump 8A has gaps 80A, 85A, and 86A. The gap 80A is located between the bump 81A and the bump 82A in the second direction D22. The gap 85A is located between the bump 81A and the bump 83A in the first direction D21. The gap 86A is located between the bump 82A and the bump 84A in the first direction D21.

The second long bump 8B includes four bumps 81B to 84B. Two bumps 81B and 82B are arranged along the second direction D22. The two bumps 81B and 82B are disposed so that their longitudinal directions are along the second direction D22. Two bumps 83B and 84B are disposed so that their longitudinal directions are along the first direction D21. The second long bump 8B has gaps 80B, 85B, and 86B. The gap 80B is located between the bump 81B and the bump 82B in the second direction D22. The gap 85B is located between the bump 81B and the bump 83B in the first direction D21. The gap 86B is located between the bump 82B and the bump 84B in the first direction D21.

As for the input terminal 28 of the first amplifier component 21, its three sides are surrounded by the four bumps 81A to 84A. More particularly, the bumps 81A and 82A are disposed between the input terminal 28 of the first amplifier component 21 and the first output transformer 22 in the first direction D21. Furthermore, the input terminal 28 of the first amplifier component 21 is disposed between the bump 83A and the bump 84A in the second direction D22.

As for the input terminal 38 of the second amplifier component 31, its three sides are surrounded by the four bumps 81B to 84B. More particularly, the bumps 81B and 82B are disposed between the input terminal 38 of the second amplifier component 31 and the second output transformer 32 in the first direction D21. Furthermore, the input terminal 38 of the second amplifier component 31 is disposed between the bump 83B and the bump 84B in the second direction D22.

(2) Effects

In the radio-frequency module 1 according to Embodiment 7, as in Embodiment 6, the long bump 8 (first long bump 8A) is located between the input terminal 28 of the first amplifier component 21 and the first output transformer 22 when viewed in plan in the thickness direction D1 of the substrate 7. Thus, the influence of the first transmission signal at the input terminal 28 of the first amplifier component 21 can be reduced. Similarly, as in Embodiment 6, the long bump 8 (second long bump 8B) is located between the input terminal 38 of the second amplifier component 31 and the second output transformer 32 when viewed in plan in the thickness direction D1 of the substrate 7. Thus, the influence of the second transmission signal at the input terminal 38 of the second amplifier component 31 can be reduced.

The embodiments and modification described above are merely some of various embodiments and modifications of the present disclosure. Furthermore, various changes can be made to the embodiments and modification in accordance with a design or the like as long as the aim of the present disclosure can be achieved.

In the present description, an expression "an element is disposed on a first main surface of a substrate" includes not only a case where the element is mounted directly on the first main surface of the substrate, but also a case where, of a first main surface-side space and a second main surface-side space that are separated by the substrate, the element is disposed in the first main surface-side space. That is, the expression "an element is disposed on a first main surface of a substrate" includes a case where the element is mounted on the first main surface of the substrate with another circuit element, an electrode, or the like interposed between the element and the first main surface. Examples of the element include, but are not limited to, the first amplifier component 21 and the second amplifier component 31.

In the present description, an expression "a first element overlaps a second element when viewed in plan in a thickness direction of a substrate" includes, when viewed in plan in the thickness direction of the substrate, a case where the whole of the first element coincides with the whole of the second element, a case where the whole of the first element coincides with part of the second element, a case where part of the first element coincides with the whole of the second element, and a case where part of the first element coincides with part of the second element. In short, the expression "a first element overlaps a second element when viewed in plan in a thickness direction of a substrate" refers to "at least part of the first element coincides with at least part of the second element".

In the present description, an expression "a third element is disposed between a first element and a second element when viewed in plan in a thickness direction of a substrate" refers to the fact that at least one of a plurality of line segments connecting random points within the first element with random points within the second element passes through a region of the third element when viewed in plan in the thickness direction of the substrate. Furthermore, an expression that something is viewed in plan in a thickness direction of a substrate refers to the fact that the substrate and an electronic component mounted on the substrate are orthographically projected onto a plane parallel to a main surface of the substrate and are viewed.

ASPECTS

The present description discloses the following aspects.

A radio-frequency module (1) according to a first aspect includes a first power amplifier circuit (2), a second power amplifier circuit (3), and a substrate (7). The first power amplifier circuit (2) amplifies a first transmission signal in a transmission band of a first communication band. The second power amplifier circuit (3) amplifies a second transmission signal in a transmission band of a second communication band. The substrate (7) has one main surface (first main surface 71). The first power amplifier circuit (2) includes a first amplifier component (21) and a first transformer (first output transformer 22; 22a, 22b). The first amplifier component (21) includes a first amplifier element (23) and a second amplifier element (24). The first transformer includes a first coil (25) and a second coil (26; 26a, 26b). A first end (251) of the first coil (25) is connected to an output terminal (232) of the first amplifier element (23). A second end (252) of the first coil (25) is connected to an output terminal (242) of the second amplifier element (24). The second coil (26; 26a, 26b) is connected to an output terminal (27) of the first power amplifier circuit (2). The second power amplifier circuit (3) includes a second amplifier component (31) and a second transformer (second output transformer 32; 32a, 32b). The second amplifier component (31) includes a third amplifier element (33; 33a, 33b) and a fourth amplifier element (34; 34a, 34b). The second transformer includes a third coil (35; 35a, 35b) and a fourth coil (36; 36a, 36b). A first end (351) of the third coil (35; 35a, 35b) is connected to an output terminal (332) of the third amplifier element (33; 33a, 33b). A second end (352) of the third coil (35; 35a, 35b) is connected to an output terminal (342) of the fourth amplifier element (34; 34a, 34b). The fourth coil (36; 36a, 36b) is connected to an output terminal (37) of the second power amplifier circuit (3). The radio-frequency module (1) further includes a long bump (8) disposed on the one main surface of the substrate (7). The first amplifier component (21) is disposed on the one main surface of the substrate (7) with the long bump (8) interposed between the first amplifier component (21) and the one main surface of the substrate (7). The long bump (8) is located between the first transformer and the second transformer when viewed in plan in a thickness direction (D1) of the substrate (7).

In the radio-frequency module (1) according to the first aspect, the long bump (8) can reduce the entry of a magnetic flux (φ1) from the first transformer (first output transformer 22; 22a, 22b) to a second transformer (second output transformer 32; 32a, 32b) side, and thus deterioration of characteristics can be reduced.

In the radio-frequency module (1) according to a second aspect, in the first aspect, a width (W21) of the long bump (8) is wider than a width (W11) of the second coil (26; 26a, 26b) of the first transformer (first output transformer 22; 22a, 22b).

The radio-frequency module (1) according to the second aspect can further block the magnetic flux (φ1) from the second coil (26; 26a, 26b) of the first transformer (first output transformer 22; 22a, 22b) and thus can further reduce deterioration of characteristics.

In the radio-frequency module (1) according to a third aspect, in the first or second aspect, the substrate (7) includes a thermal via (73). A width of the thermal via (73) is wider than the width (W11) of the second coil (26; 26a, 26b) of the first transformer (first output transformer 22; 22a, 22b).

In the radio-frequency module (1) according to the third aspect, the thermal via (73) can reduce the entry of the magnetic flux (φ1) from the first transformer (first output transformer 22; 22a, 22b) to the second transformer (second output transformer 32; 32a, 32b) side within the substrate (7) as well, and thus deterioration of characteristics can be further reduced.

In the radio-frequency module (1) according to a fourth aspect, in any one of the first to third aspects, the first transformer (first output transformer 22; 22a; 22b) and the second transformer (second output transformer 32; 32a; 32b) differ from each other in winding direction when viewed in plan in the thickness direction (D1) of the substrate (7).

The radio-frequency module (1) according to the fourth aspect can reduce the influence of the magnetic flux (φ1) from the first transformer (first output transformer 22; 22a; 22b) in the second transformer (second output transformer 32a; 32b).

In the radio-frequency module (1) according to a fifth aspect, in any one of the first to third aspects, the first transformer (first output transformer 22a; 22b) and the second transformer (second output transformer 32b; 32a) are identical in winding direction when viewed in plan in the thickness direction (D1) of the substrate (7).

The radio-frequency module (1) according to the fifth aspect further increases the effect in which the long bump (8) reduces the entry of the magnetic flux (φ1).

In the radio-frequency module (1) according to a sixth aspect, in any one of the first to fifth aspects, the long bump (8) includes a plurality of bumps (81A, 82A).

In the radio-frequency module (1) according to a seventh aspect, in the sixth aspect, the long bump (8) does not overlap a central portion of the first transformer (first output transformer 22) when viewed in plan in the thickness direction (D1) of the substrate (7).

In the radio-frequency module (1) according to an eighth aspect, in any one of the first to seventh aspects, the first amplifier component (21) includes an input terminal (28). The long bump (8) is located between the input terminal (28) of the first amplifier component (21) and the first transformer (first output transformer 22) when viewed in plan in the thickness direction (D1) of the substrate (7).

The radio-frequency module (1) according to the eighth aspect can reduce influence on at least one of the first transmission signal and the second transmission signal at the input terminal (28) of the first amplifier component (21).

In the radio-frequency module (1) according to a ninth aspect, in any one of the first to eighth aspects, the second power amplifier circuit (3) is a Doherty amplifier circuit.

In the radio-frequency module (1) according to the ninth aspect, in the Doherty amplifier circuit as well, deterioration of characteristics can be reduced.

In the radio-frequency module (1) according to a tenth aspect, in any one of the first to ninth aspects, the first transformer (first output transformer 22; 22a; 22b), the first amplifier component (21), the second amplifier component (31), and the second transformer (second output transformer 32; 32a; 32b) are arranged in this order when viewed in plan in the thickness direction (D1) of the substrate (7).

In the radio-frequency module (1) according to the tenth aspect, the first transformer (first output transformer 22; 22a; 22b) and the second transformer (second output transformer 32; 32a; 32b) can be kept away from each other, and thus the influence of the magnetic flux (φ1) from the first transformer in the second transformer can be further reduced.

In the radio-frequency module (1) according to an eleventh aspect, in any one of the first to tenth aspects, transmission in the first communication band and transmission in the second communication band can be used simultaneously.

A communication device (9) according to a twelfth aspect includes the radio-frequency module (1) according to any one of the first to eleventh aspects, and a signal processing circuit (92). The signal processing circuit (92) processes a signal for the radio-frequency module (1).

In the communication device (9) according to the twelfth aspect, in the radio-frequency module (1), the long bump (8) can reduce the entry of the magnetic flux (φ1) from the first transformer (first output transformer 22; 22*a*, 22*b*) to the second transformer (second output transformer 32; 32*a*, 32*b*) side, and thus deterioration of characteristics can be reduced.

REFERENCE SIGNS LIST 1 radio-frequency module
2 first power amplifier circuit
21 first amplifier component
22, 22*a*, 22*b* first output transformer (first transformer)
23 first amplifier element
231 input terminal
232 output terminal
24 second amplifier element
241 input terminal
242 output terminal
25 first coil
251 first end
252 second end
26, 26*a*, 26*b* second coil
261 first end
262 second end
27 output terminal
28 input terminal
3 second power amplifier circuit
31 second amplifier component
32, 32*a*, 32*b* second output transformer (second transformer)
33, 33*a*, 33*b* third amplifier element
331 input terminal
332 output terminal
34, 34*a*, 34*b* fourth amplifier element
341 input terminal
342 output terminal
35, 35*a*, 35*b* third coil
351 first end
352 second end
36, 36*a*, 36*b* fourth coil
361 first end
362 second end
37 output terminal
38 input terminal
41 first transmission filter
42 second transmission filter
5 antenna terminal
51 first antenna terminal
52 second antenna terminal
6 switch
61, 62 common terminal
63, 64 selection terminal
7 substrate
71 first main surface (one main surface)
72 second main surface
73 thermal via
73A first thermal via
73B second thermal via
8 long bump
8A first long bump
8B second long bump
80A, 80B gap
81A to 84A, 81B to 84B bump 9 communication device
91 antenna
911 first antenna
912 second antenna
92 signal processing circuit
93 baseband signal processing circuit
94 RF signal processing circuit
W11, W12 width
W21, W22 width
φ1, φ2 magnetic flux
D1 thickness direction
D21 first direction
D22 second direction

The invention claimed is:
1. A radio-frequency module comprising:
a first power amplifier circuit configured to amplify a first transmission signal in a transmission band of a first communication band;
a second power amplifier circuit configured to amplify a second transmission signal in a transmission band of a second communication band; and
a substrate having one main surface,
wherein the first power amplifier circuit includes
a first amplifier component including a first amplifier element and a second amplifier element, and
a first transformer including a first coil and a second coil,
wherein a first end of the first coil is connected to an output terminal of the first amplifier element,
wherein a second end of the first coil is connected to an output terminal of the second amplifier element,
wherein the second coil is connected to an output terminal of the first power amplifier circuit,
wherein the second power amplifier circuit includes
a second amplifier component including a third amplifier element and a fourth amplifier element, and
a second transformer including a third coil and a fourth coil,
wherein a first end of the third coil is connected to an output terminal of the third amplifier element,
wherein a second end of the third coil is connected to an output terminal of the fourth amplifier element,
wherein the fourth coil is connected to an output terminal of the second power amplifier circuit,
wherein the radio-frequency module further comprises a bump disposed on the one main surface of the substrate,
wherein the first amplifier component is disposed on the one main surface of the substrate with the bump interposed between the first amplifier component and the one main surface of the substrate, and
wherein the bump is located between the first transformer and the second transformer when viewed in plan in a thickness direction of the substrate.
2. The radio-frequency module according to claim 1, wherein a width of the bump is wider than a width of the second coil of the first transformer.
3. The radio-frequency module according to claim 2, wherein the substrate includes a thermal via, and wherein a width of the thermal via is wider than a width of the second coil of the first transformer.
4. The radio-frequency module according to claim 3, wherein the first transformer and the second transformer differ from each other in winding direction when viewed in plan in the thickness direction of the substrate.

5. The radio-frequency module according to claim 3, wherein the first transformer and the second transformer are identical in winding direction when viewed in plan in the thickness direction of the substrate.

6. The radio-frequency module according to claim 5, wherein the bump includes a plurality of bumps.

7. The radio-frequency module according to claim 6, wherein the bump does not overlap a central portion of the first transformer when viewed in plan in the thickness direction of the substrate.

8. The radio-frequency module according to claim 7, wherein the first amplifier component includes an input terminal, and wherein the bump is located between the input terminal of the first amplifier component and the first transformer when viewed in plan in the thickness direction of the substrate.

9. The radio-frequency module according to claim 8, wherein the second power amplifier circuit is a Doherty amplifier circuit.

10. The radio-frequency module according to claim 9, wherein the first transformer, the first amplifier component, the second amplifier component, and the second transformer are arranged in this order when viewed in plan in the thickness direction of the substrate.

11. The radio-frequency module according to claim 10, wherein transmission in the first communication band and transmission in the second communication band can be used simultaneously.

12. A communication device comprising:

the radio-frequency module according to claim 1; and a signal processing circuit configured to process a signal for the radio-frequency module.

13. The radio-frequency module according to claim 1, wherein the substrate includes a thermal via, and wherein a width of the thermal via is wider than a width of the second coil of the first transformer.

14. The radio-frequency module according to claim 13, wherein the first transformer and the second transformer differ from each other in winding direction when viewed in plan in the thickness direction of the substrate.

15. The radio-frequency module according to claim 13, wherein the first transformer and the second transformer are identical in winding direction when viewed in plan in the thickness direction of the substrate.

16. The radio-frequency module according to claim 15, wherein the bump includes a plurality of bumps.

17. The radio-frequency module according to claim 16, wherein the bump does not overlap a central portion of the first transformer when viewed in plan in the thickness direction of the substrate.

18. The radio-frequency module according to claim 17, wherein the first amplifier component includes an input terminal, and wherein the bump is located between the input terminal of the first amplifier component and the first transformer when viewed in plan in the thickness direction of the substrate.

19. The radio-frequency module according to claim 18, wherein the second power amplifier circuit is a Doherty amplifier circuit.

20. The radio-frequency module according to claim 19, wherein the first transformer, the first amplifier component, the second amplifier component, and the second transformer are arranged in this order when viewed in plan in the thickness direction of the substrate, and wherein transmission in the first communication band and transmission in the second communication band can be used simultaneously.

* * * * *